(12) United States Patent
Kakkad

(10) Patent No.: US 6,734,119 B2
(45) Date of Patent: May 11, 2004

(54) ELECTRO-OPTICAL APPARATUS AND METHOD FOR FABRICATING A FILM, SEMICONDUCTOR DEVICE AND MEMORY DEVICE AT NEAR ATMOSPHERIC PRESSURE

(75) Inventor: Ramesh H. Kakkad, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 107 days.

(21) Appl. No.: 09/778,744

(22) Filed: Feb. 8, 2001

(65) Prior Publication Data

US 2001/0041463 A1 Nov. 15, 2001

(30) Foreign Application Priority Data

Feb. 8, 2000 (JP) ........................................ 2000-030754

(51) Int. Cl.$^7$ ........................... H01L 21/26; C23C 16/00
(52) U.S. Cl. ............. 438/798; 118/723 R; 118/723 MP

(58) Field of Search .................................. 438/798, 758, 438/771, 792, 795

(56) References Cited

U.S. PATENT DOCUMENTS

| 5,858,819 A | * | 1/1999 | Miyasaka ............ 257/E29.151 |
| 6,015,859 A | * | 1/2000 | Camberlin et al. ......... 525/108 |
| 2002/0119327 A1 | * | 8/2002 | Arkles et al. ............... 428/446 |

* cited by examiner

*Primary Examiner*—W. David Coleman
(74) *Attorney, Agent, or Firm*—Oliff & Berridge, PLC

(57) ABSTRACT

A method to deposit insulating, semiconducting, and conducting films at pressures close to the atmospheric pressure and at temperatures less than 500° C. is provided. In this method, noble gas is mixed with reactant gas, and electric energy is applied to produce plasma at pressure substantially close to atmospheric pressure. The process can be applied to deposit films such as silicon dioxide, silicon nitride, silicon, and metal films.

21 Claims, 1 Drawing Sheet

ELECTRO-OPTICAL APPARATUS AND METHOD FOR FABRICATING A FILM, SEMICONDUCTOR DEVICE AND MEMORY DEVICE AT NEAR ATMOSPHERIC PRESSURE

BACKGROUND OF THE INVENTION

1. Field of Invention

The present invention relates to a method of fabricating a film. One of the major field of application of the film is in microelectronics in devices such as thin film transistors (TFTs) and metal insulator oxide (MOS) transistors.

2. Description of Related Art

A common way to deposit insulating, semiconducting and conducting films is employing a chemical vapor deposition (CVD) process. Three most commonly used CVD methods are: atmospheric pressure chemical vapor deposition (APCVD), low pressure chemical vapor deposition (LPCVD), and plasma enhanced chemical vapor deposition (PECVD).

SUMMARY OF THE INVENTION

During the CVD processes, the reactant gases are introduced in to a reaction chamber where they react at elevated temperature to form a film such as silicon dioxide film and silicon nitride film. During the CVD processes, parameters such as film deposition rate, deposition temperature and pressure are inter-related. Thus changing one parameter would affect other parameters. From the manufacturing-cost point of view, it is desired that the film should be deposited at low temperatures and as close as possible to the atmospheric pressure to reduce the high cost of vacuum tools. In the following, a quick overview is given of the order of temperatures (substrate temperature) and pressures used during depositions of silicon dioxide and silicon nitride depositions.

[Silicon dioxide deposition]

Silicon dioxide can be deposited at low temperature (300 to 500° C.) by reacting silane, oxygen, and dopants (if needed) in a CVD reactor (APCVD) or at reduced pressure in an LPCVD reactor. The deposition rate decreases and the film properties degrade as the temperature is reduced, thus usually the deposition temperature is 450° C. (or higher). These films are porous with lower density, lower dielectric strength, and higher etch rate in HF compared with the films produced using higher temperature process. The step coverage is also nonconformal.

The film properties can improved by increasing the deposition (substrate) temperature. For the deposition temperature range 500–800° C., a silicon dioxide film can be formed by decomposing tetraethylorthosilicate, $Si(OC_2H_5)_4$ or TEOS, in an LPCVD reactor, with improved film properties and conformal step coverage. At even higher temperature (900° C.), silicon dioxide can be formed by reacting dichlorosilane, $SiCl_2H_2$, with nitrous oxide at reduced pressure.

Thus silicon dioxide films produced at higher deposition temperature have better properties, but applications can be limited, for example, these films can not be deposited over a layer of aluminum. Additionally, for TFT applications which use glass substrate, the deposition temperature need to be lower than 430° C.

Alternatively, the films can be deposited by a PECVD process below 400° C. However, this process requires the use of expensive vacuum tools as plasma processes are done at reduced pressures.

[Silicon Nitride Deposition]

Silicon nitride films can be deposited by an intermediate-temperature (750° C.) LPCVD process or a low temperature (300° C.) PECVD method. Although the films can be deposited at lower temperature using the PECVD method, the process would require the use of expensive vacuum equipment as was mentioned earlier.

Thus in the case of APCVD or LPCVD depositions of silicon dioxide and silicon nitride, the deposition temperature is too high to be useful for certain applications such as TFTs. Alternatively, the films can be deposited at lower temperatures using the plasma assisted process (PECVD), but the pressure in plasma assisted process is lower which requires expensive vacuum tools.

The object of the present invention is to at least provide an inexpensive and broad applicability method for fabricating insulating films such as silicon nitride and silicon oxide films, semiconducting or conducting films such as silicon films, and conducting films such as metal films at low temperatures. Semiconductor devices, which include the fabricated insulating, semiconducting or conducting films, can be used for electro-optical apparatuses, such as an LCD display and an electroluminescence display.

In accordance with one exemplary embodiment of the present invention, fabrication of insulating, semiconducting and conducting films by excitation of noble gases along with reactant gases at the pressures substantially close to atmospheric-pressure (about 100 kPa) is provided. This may completely eliminate the need of using vacuum tools, making the equipment and the process very inexpensive compared to equipment and processes used for making similar films in TFT and semiconductor industries.

The above exemplary embodiment of fabricating films at pressures substantially close to atmospheric-pressure may be advantageous from the cost and simplicity points of view. Accordingly, even if the process pressure is reduced to as low as 1 kPa, the processes can be carried out with inexpensive vacuum tools.

DETAILED DESCRIPTION OF PREFERRED EMBODIMENTS

Since plasma-assisted processes can be carried out at lower temperature for deposition, they have an advantage over the APCVD and LPCVD processes, especially for the applications where high process temperatures are undesirable. However, the current PECVD processes require the use of expensive vacuum tools. Thus it is desirable to be able to produce plasma of reactant gases at atmospheric pressure or at a pressure close to atmospheric pressure to avoid the high cost of using the vacuum tools and to reduce the equipment footprint.

Unfortunately, as the pressure is increased, it is difficult to maintain reactant gas plasma above certain pressure. The maximum pressure up to which plasma can be maintained depends upon the reactant gas(es) used in the process.

On the other hand, noble gases such as helium and neon can be excited at pressures as high as atmospheric pressure by application of electric energy. If large amount of noble gas is mixed with the reactant gases, then it is possible to create a plasma containing reactant gases at pressures as high as atmospheric pressures. In this case, first the noble gas plasma is produced upon the application of electric (or other) energy to the gas mixture. The noble gas radicals and ions subsequently collide with the reactant gas molecules to create the reactant gas radicals and ions to form plasma. The reactant gas(es) ions and radicals react to form the film with desired composition on a substrate. Thus, the noble gas does not react with any of the reactant gases, but simply aids the formation of plasma. Accordingly, it is possible to produce films such as silicon dioxide, silicon nitride at pressures as high as atmospheric pressure, and at temperatures below 430° C. (maximum temperature allowed in TFT fabrication) by using this process. It was found that the noble gas plasma could be easily produced at pressure close to atmospheric pressure when the frequency of electric power was in the range from 1 kHz to 100 MHz. A plasma was more effectively formed at the atmospheric pressure when the distance between the electrodes on which electric energy was applied was less than 5 mm.

Figure 1A:
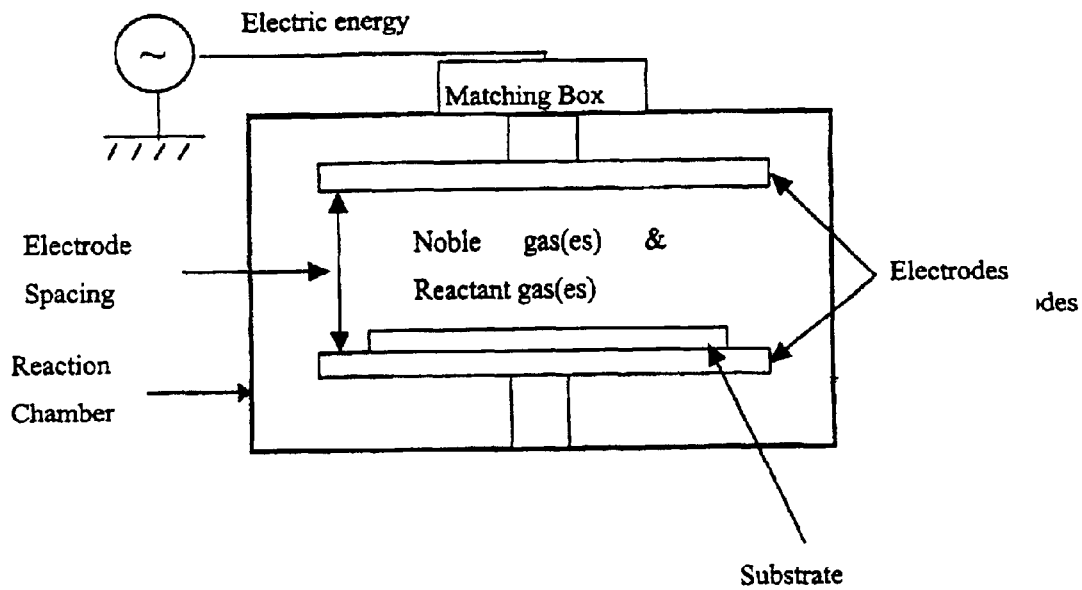
FIG. 1a is a schematic of plasma production in a mixture of reactant gas(es) and noble gas(es) by application of electric field.

For example, as shown in FIG. 1a, to deposit silicon dioxide using this process, a mixture of noble gas, TEOS and oxygen or a mixture of noble gas, silane and oxygen can be introduced in to the chamber. By application of electric field between the electrodes, the plasma of noble gas and reactant gases can be created at pressures close to atmospheric pressure. The reactive species of plasma react to deposit silicon dioxide film on the substrate. Silicon nitride can be deposited in a similar way by introducing reactant gases such as $NH_3$ and silane along with noble gases in the chamber, and applying electric power to create a plasma at pressure close to atmospheric pressure.

Of course, the application of this process is not limited to deposition of silicon dioxide or silicon nitride films, but it can be applied to deposition of any films currently deposited by conventional PECVD APCVD or LPCVD processes. For example, deposition of amorphous or microcrystalline silicon films uses the conventional PECVD process. By adding the noble gas to the reactant gas mixture, we can increase the deposition pressures to as high as atmospheric pressure. In the case of the conventional LPCVD process used for deposition of amorphous silicon and polysilicon, the deposition temperature is usually higher than 500° C. to achieve practical deposition rates, as there is no plasma used during this process. By adding noble gas(es) to the reactant gas(es), it is possible to produce plasma regardless of the pressure used which will give increased deposition rate, even if the deposition temperature is lowered. Additionally, the disclosed process can also be applied to deposition of metal or alloy films. For example, tungsten can be deposited by using reactant such as $WF_6$ along with noble gas, and creating a plasma at pressure close to one atmosphere.

Even though it is possible to create plasma at higher pressure by adding noble gas or a mixture of multiple noble gases to the reactant gases, the method can also be used at lower pressure, where the addition of noble gas(es) aids the plasma formation.

Figure 1B:
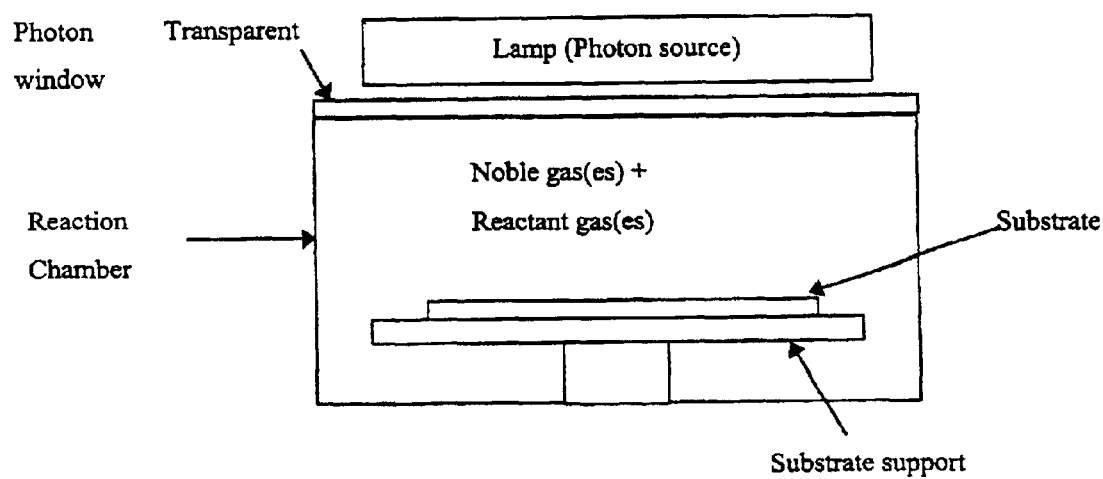
FIG. 1b is a schematic of plasma production in a mixture of reactant gas(es) and noble gas(es) by using photons.

In this process described above, electric energy was used to excite the noble gases. However, it is also possible to use optical energy to excite noble gases to higher energy, as shown in FIG. 1b. Each noble gas has discrete excitation energy. For example, the first excitation level for argon is 11.6 eV. Thus, if photon with energy higher than 11.6 eV are used, argon can be excited, which subsequently can excite reactant gases to form reactive species which react to form film with desired composition.

The insulating films produced by the disclosed processes can be used as interlayer dielectric of a semiconductor device. The insulating films can also be used as gate insulator of a part of the gate insulator of a metal insulator semiconductor (MIS) device such as MOSFET, TFT or SOI device. Conducting films such as metal films fabricated using the disclosed process can be used as contacts to such devices. The semiconducting films produced can be used as active layers of MIS or photovoltaic type devices.

What is claimed is:

1. A plasma enhanced method for fabricating a film, comprising:

introducing a gas mixture of a noble gas and reactant gas into a chamber; and supplying an electrical energy to a gas mixture such that a noble gas plasma is produced and that noble gas radicals and ions subsequently collide with the reactant gas to form reactant gas radicals and ions to form a plasma of the reactant gas, which enable the plasma to be formed under a pressure of 90 kPa to 110 kPa, the electric energy being applied between electrodes to form the plasma, the distance between the electrodes being less than 5 mm, the reactant gas radicals and ions reacting to form the film.

2. The method of claim 1, said energy being supplied to the gas mixture by electric power in a frequency range of 1 kHz to 100 MHz.

3. The method of claim 1, one of helium, argon, neon krypton, xenon or one of a mixture of at least two chosen from a group consisting of helium, argon neon, krypton and xenon being used as noble gas.

4. The method of claim 1, temperature of the substrate on which said film is to be formed being in a range of 25 to 500° C.

5. The method of claim 1, the film being silicon dioxide or having a composition close to silicon dioxide.

6. The method of claim 1, the film being silicon nitride or having a composition close to silicon nitride.

7. The method of claim 1, the film being one of a silicon film, a doped silicon film, and a hydrogenated-silicon film.

8. The method of claim 1, the film being one of a metal and an alloy film.

9. A semiconductor device comprising a film fabricated according to the method of claim 1.

10. The semiconductor device of claim 9, the semiconductor device being one of a metal oxide semiconductor field effect transistor device, a thin film transistor, and a silicon on insulator device.

11. The semiconductor device of claim 9, the semiconductor device being a photovoltaic device.

12. An electro-optical apparatus comprising the semiconductor device of claim 9.

13. A memory device comprising a film fabricated according to the method of claim 1.

14. The memory device of claim 13, the memory device being one of a metal oxide semiconductor field effect transistor device, a thin film transistor, and a silicon on insulator device.

15. The memory device of claim 13, the memory device being a photovoltaic device.

16. A plasma enhanced method for fabricating a film, comprising:

introducing a gas mixture of a noble gas and reactant gas into a chamber; and supplying an electrical energy to a gas mixture such that a noble gas plasma is produced and that noble gas radicals and ions subsequently collide with the reactant gas to form reactant gas radicals and ions to form a plasma of the reactant gas, which enable the plasma to be formed under a pressure of 1 kPa to 110 kPa, the electric energy being applied between electrodes to form the plasma, the distance between the electrodes being less than 5 mm, the reactant gas radicals and ions reacting to form the film.

17. A plasma enhanced method for fabricating a film, the method comprising:

supplying optical energy with a light of wavelength less than 200 nanometer to a mixture of noble gas and reactant gas to form a plasma and create reactive species, the reactive species forming a film on a substrate, the optical energy being used for producing noble gas radicals and ions, the noble gas radicals and ions being excited by the optical energy and colliding with the reactant gas to form the plasma.

18. A semiconductor device comprising a film fabricated according to the method of claim 17.

19. A memory device comprising a film fabricated according to the method of claim 17.

20. A plasma enhanced method for fabricating a semiconductor device, comprising:

a step of forming a film by:

introducing a gas mixture of a noble gas and reactant gas into a chamber; and supplying an electrical energy to a gas mixture such that a noble gas plasma is produced and that noble gas radicals and ions subsequently collide with the reactant gas to form reactant gas radicals and ions to form a plasma of the reactant gas, which enable the plasma to be formed under a pressure of 90 kPa to 110 kPa, the electric energy being applied between electrodes to form the plasma, the distance between the electrodes being less than 5 mm, the reactant gas radicals and ions reacting to form the film.

21. A plasma enhanced method for fabricating a memory device, comprising:

a step of forming a film by:

introducing a gas mixture of a noble gas and reactant gas into a chamber; and supplying an electrical energy to a gas mixture such that a noble gas plasma is produced and that noble gas radicals and ions subsequently collide with the reactant gas to form reactant gas radicals and ions to form a plasma of the reactant gas, which enable the plasma to be formed under a pressure of 90 kPa to 110 kPa, the electric energy being applied between electrodes to form the plasma, the distance between the electrodes being less than 5 mm, the reactant gas radicals and ions reacting to form the film.

* * * * *